(12) United States Patent
Takebayashi (10) Patent No.: US 12,046,485 B2
(45) Date of Patent: Jul. 23, 2024

(54) SUBSTRATE PROCESSING APPARATUS AND METHOD OF CLEANING SUBSTRATE PROCESSING APPARATUS

(71) Applicant: Tokyo Electron Limited, Tokyo (JP)

(72) Inventor: Shusei Takebayashi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 572 days.

(21) Appl. No.: 17/293,192

(22) PCT Filed: Nov. 11, 2019

(86) PCT No.: PCT/JP2019/044188
§ 371 (c)(1),
(2) Date: May 12, 2021

(87) PCT Pub. No.: WO2020/100829
PCT Pub. Date: May 22, 2020

(65) Prior Publication Data
US 2022/0005709 A1 Jan. 6, 2022

(30) Foreign Application Priority Data
Nov. 16, 2018 (JP) .................................. 2018-215775

(51) Int. Cl.
*H01L 21/67* (2006.01)
*H01L 21/687* (2006.01)
*H01L 21/304* (2006.01)

(52) U.S. Cl.
CPC .. *H01L 21/67051* (2013.01); *H01L 21/67034* (2013.01); *H01L 21/67098* (2013.01);
(Continued)

(58) Field of Classification Search
CPC ......... H01L 21/67051; H01L 21/67034; H01L 21/67098; H01L 21/68742;
(Continued)

(56) References Cited

U.S. PATENT DOCUMENTS

| 2013/0319476 A1* | 12/2013 | Aiura | H01L 21/67115 134/33 |
| 2014/0041689 A1* | 2/2014 | Namba | H01L 21/02019 156/345.23 |

(Continued)

FOREIGN PATENT DOCUMENTS

JP 2015-216224 A 12/2015

OTHER PUBLICATIONS

JP 2016-063193 (Year: 2016).*

*Primary Examiner* — Alexander Markoff
(74) *Attorney, Agent, or Firm* — Nath, Goldberg & Meyer; Jerald L. Meyer; Tanya E. Harkins (57) ABSTRACT

A controller of a substrate processing apparatus causes execution of: a cleaning process of cleaning at least a bottom surface of a cover by a cleaning liquid that fills a space between a top surface of a substrate and the bottom surface of the cover by supplying, in a state in which a vertical distance between the top surface of a substrate (a cleaning substrate) held by a substrate holder and the bottom surface of the cover is set to a first distance, the cleaning liquid to the top surface of the substrate while rotating the substrate; and after the cleaning process, a drying process of drying at least the bottom surface of the cover by stopping, in a state in which the vertical distance is set to a second distance greater than the first distance, the supply of the cleaning liquid while rotating the substrate.

8 Claims, 5 Drawing Sheets

(52) U.S. Cl.
CPC .. *H01L 21/68742* (2013.01); *H01L 21/68764* (2013.01); *H01L 21/304* (2013.01)

(58) Field of Classification Search
CPC ............. H01L 21/68764; H01L 21/304; H01L 21/02087; H01L 21/67028; H01L 21/68735; H01L 21/02041; B08B 3/02
See application file for complete search history.

(56) References Cited

U.S. PATENT DOCUMENTS

| | | | | |
|---|---|---|---|---|
| 2014/0116478 | A1* | 5/2014 | Higashijima | ..... H01L 21/67051 |
| | | | | 134/104.2 |
| 2015/0323250 | A1* | 11/2015 | Mizuno | ............. H01L 21/67109 |
| | | | | 156/345.19 |
| 2019/0385835 | A1* | 12/2019 | Kobayashi | ........ H01L 21/67103 |

* cited by examiner

SUBSTRATE PROCESSING APPARATUS AND METHOD OF CLEANING SUBSTRATE PROCESSING APPARATUS

This is a National Phase Application filed under 35 U.S.C. 371 as a national stage of PCT/JP2019/044188, filed Nov. 11, 2019, an application claiming the benefit of Japanese Application No. 2018-215775, filed Nov. 16, 20218, the content of each of which is hereby incorporated by reference in its entirety.

TECHNICAL FIELD

The present disclosure relates to a substrate processing apparatus and a method of cleaning the substrate processing apparatus.

BACKGROUND

A semiconductor device manufacturing process includes a substrate processing in which, while rotating a semiconductor wafer (hereinafter, simply referred to as a "wafer") as a substrate to be processed, a processing liquid such as a chemical liquid is supplied to a peripheral edge portion of the wafer so that an unnecessary film or contaminants on the peripheral edge portion is removed. As a substrate processing apparatus that performs such a substrate processing, an apparatus including a cover for covering a top surface of a wafer is known (see Patent Document 1). The cover rectifies a gas flow flowing in a vicinity the peripheral edge portion of the wafer and increases a flow velocity so as to prevent the processing liquid scattered from the wafer from adhering to the top surface of the wafer again. On the other hand, a mist of the processing liquid scattered from the wafer may adhere to the surface of the cover.

PRIOR ART DOCUMENT

Patent Document

Patent Document 1: Japanese Laid-Open Patent Publication No. 2015-216224

SUMMARY

The present disclosure provides a technique capable of cleaning a cover efficiently by a cleaning liquid and capable of drying the cover wet with the cleaning liquid in a short time.

An embodiment of a substrate processing apparatus includes: a substrate holder configured to hold a substrate; a rotation drive part configured to rotate the substrate holder; a cover configured to cover a top surface of the substrate held by the substrate holder; a lifting mechanism configured to move the cover vertically; a cleaning liquid supply part configured to supply a cleaning liquid to the top surface of the substrate covered by the cover; and a controller configured to control the substrate processing apparatus to perform: a cleaning process of cleaning at least a bottom surface of the cover by the cleaning liquid that fills a space between the top surface of the substrate and the bottom surface of the cover by supplying, in a state in which a vertical distance between the top surface of the substrate held by the substrate holder and the bottom surface of the cover is set to a first distance, the cleaning liquid to the top surface of the substrate from the cleaning liquid supply part while rotating the substrate by the rotation drive part; and after the cleaning process, a drying process of drying at least the bottom surface of the cover by stopping, in a state in which the vertical distance is set to a second distance greater than the first distance, the supply of the cleaning liquid from the cleaning liquid supply part while rotating the substrate by the rotation drive part.

According to the present disclosure, it is possible to efficiently clean a cover by a cleaning liquid and to dry the cover wet with the cleaning liquid in a short time.

DETAILED DESCRIPTION

An embodiment of a substrate processing apparatus 1 will be described with reference to the accompanying drawings.

The substrate processing apparatus 1 according to an embodiment is configured to remove an unnecessary film formed on a peripheral edge portion of a wafer W by supplying a chemical liquid to the peripheral edge portion of the wafer W, which is a circular substrate on which semiconductor devices are formed.

Figure 1:
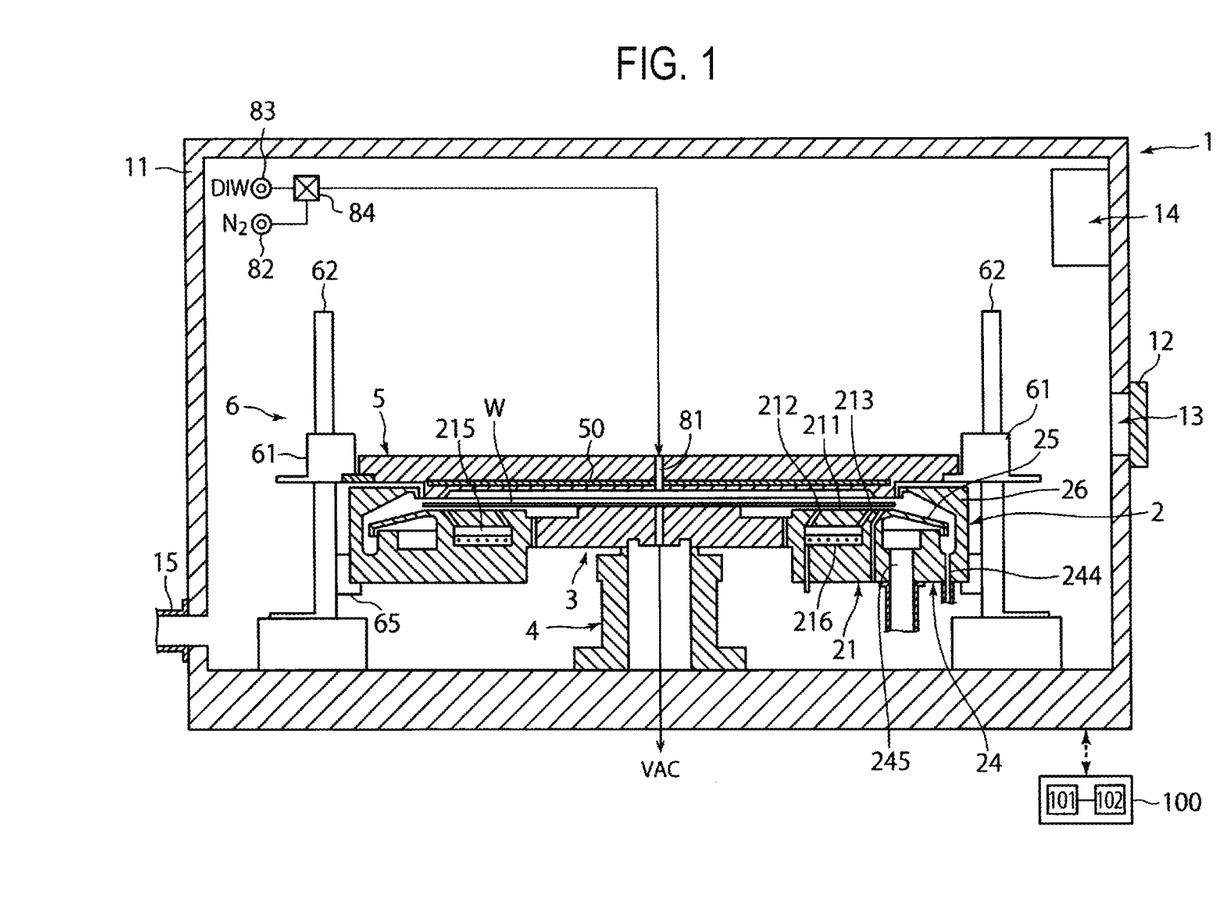
FIG. 1 is a vertical cross-sectional view of a substrate processing apparatus according to an embodiment.
Figure 2:
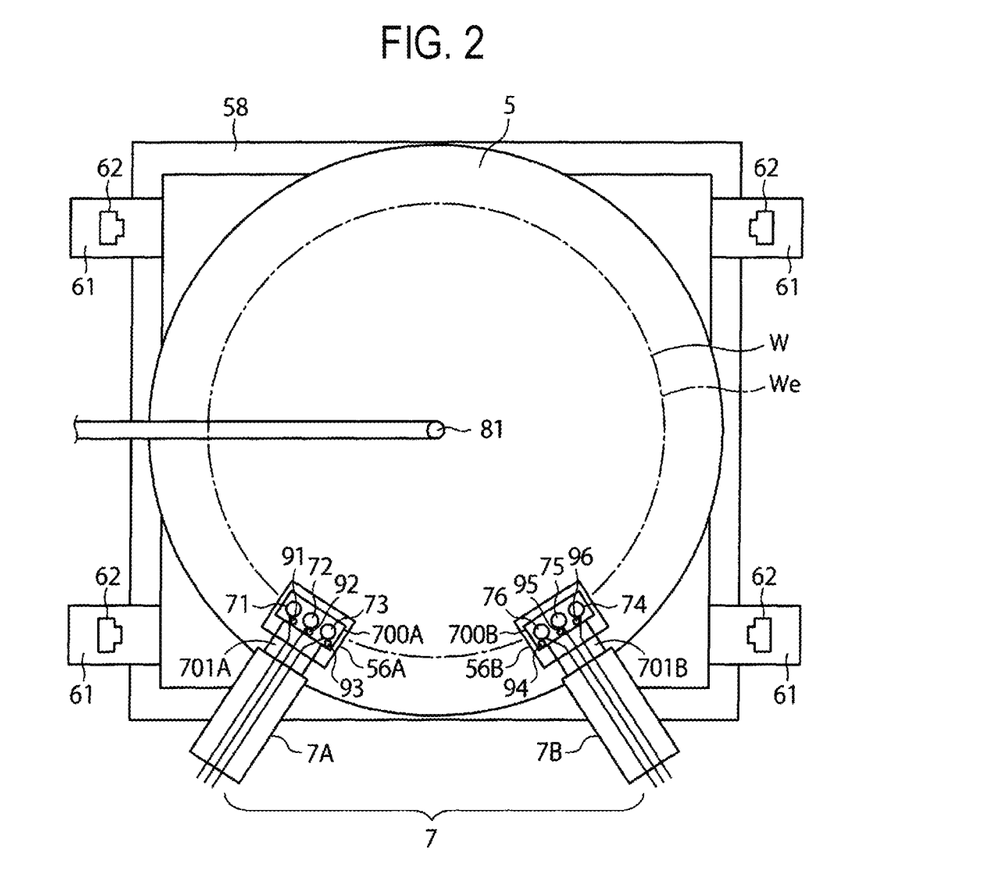
FIG. 2 is a plan view illustrating a cover of the substrate processing apparatus illustrated in FIG. 1, a lifting mechanism for the cover, and a processing fluid supply part.

As illustrated in FIGS. 1 and 2, the substrate processing apparatus 1 includes a wafer holder 3 configured to hold the wafer W horizontally and rotatably about a vertical axis, a cup body 2 surrounding a circumference of the wafer W held by the wafer holder 3 and configured to receive a processing liquid scattered from the wafer W, a disk-shaped cover 5 configured to cover an entirety of a top surface of the wafer W held by the wafer holder 3, a lifting mechanism (a moving mechanism) 6 configured to move the cover 5 vertically, and a processing fluid supply part 7 (illustrated only in FIG. 2) configured to supply a processing fluid to the wafer W held by the wafer holder 3.

The cup body 2, the wafer holder 3, the cover 5, and the like, which are constituent components of the substrate processing apparatus 1 described above, are accommodated in a single housing 11. A clean air introduction unit 14 configured to introduce clean air from the outside is provided in a vicinity of a ceiling of the housing 11. An exhaust port 15 configured to exhaust an atmosphere within the housing 11 is provided in a vicinity of a bottom surface of the housing 11. Therefore, a downflow of clean air flowing from an upper portion to a lower portion of the housing 11 is formed in the housing 11. A loading and unloading port 13, which is opened and closed by a shutter 12, is provided in one side wall of the housing 11. A transfer arm of a wafer transfer mechanism (not illustrated) provided outside the housing 11 can pass through the loading and unloading port 13 in a state of holding the wafer W. The wafer holder 3 is configured as a disk-shaped vacuum chuck having a diameter smaller than that of the wafer W, and a top surface thereof is a wafer suction surface. The wafer holder 3 can be rotated at a desired speed by, for example, a rotation drive part 4 (details of which are not illustrated) provided with an electric motor.

Figure 3:
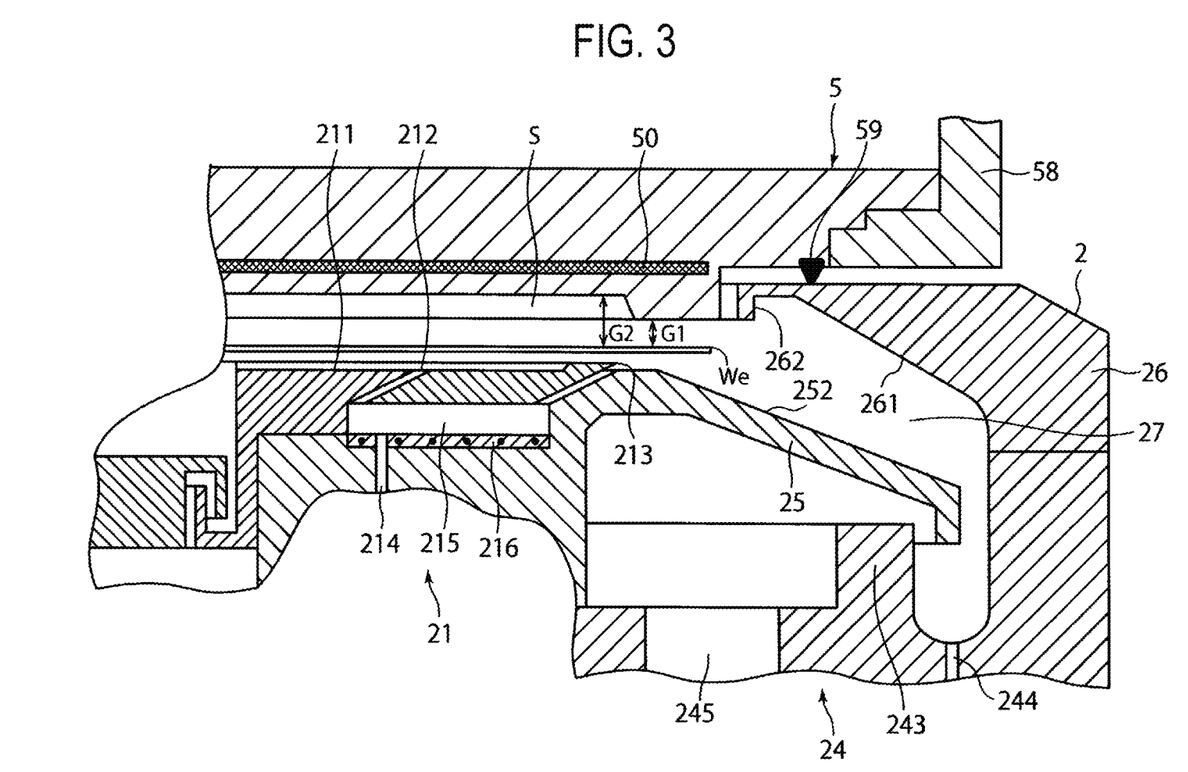
FIG. 3 is an enlarged cross-sectional view illustrating in detail an area in a vicinity of an outer peripheral edge of a wafer on a right-hand side of FIG. 1.

As illustrated in FIGS. 1 and 3, the cup body 2 is a bottomed annular member provided so as to surround an outer circumference of the wafer holder 3. The cup body 2 has a role of receiving and collecting a chemical liquid scattered to the outside of the wafer W after being supplied to the wafer W and discharging the chemical liquid to the outside.

Between a bottom surface of the wafer W held by the wafer holder 3 and a top surface 211 of an inner periphery side portion 21 of the cup body 2 facing the bottom surface of the wafer W, a small gap (having a vertical length of, for example, about 2 to 3 mm) is formed. Two gas ejection ports 212 and 213 are opened in the top surface 211. These two gas ejection ports 212 and 213 extend continuously or intermittently along a large-diameter circle and a small-diameter circle, which are concentric with each other. From the gas ejection ports 212 and 213, a nitrogen ($N_2$) gas, which has been heated, is ejected in a radially outward and obliquely upward direction toward the bottom surface of the wafer W.

The $N_2$ gas is supplied to an annular gas diffusion space 215 from one or more gas introduction lines 214 (only one gas introduction line 214 is illustrated in FIG. 3) formed in the inner periphery side portion 21 of the cup body 2. The $N_2$ gas flows in the gas diffusion space 215 while diffusing in a circumferential direction. A heater 216 is provided adjacent to the gas diffusion space 215. The $N_2$ gas is heated by the heater 216 while flowing in the gas diffusion space 215, and is then ejected from the gas ejection ports 212 and 213. The $N_2$ gas ejected from the gas ejection port 213 located at a radially outer side promotes a reaction by a chemical liquid by heating the peripheral edge portion of the wafer W, which is a processing target portion of the wafer W. In addition, the $N_2$ gas ejected from the gas ejection port 213 prevents a mist of a processing liquid scattered after being ejected toward a front surface (top surface) of the wafer W from wrapping around a rear surface (bottom surface) of the wafer W. The $N_2$ gas ejected from the gas ejection port 212 located at a radially inner side prevents distortion of the wafer W that may occur when the gas ejection port 212 is not provided. When there is no gas ejection port 212, the distortion of the wafer W may occur, for example, because only the peripheral edge portion of the wafer W is heated by the gas from the gas ejection port 213, or because a negative pressure is generated in a vicinity of the bottom surface of the wafer W at a center portion of the wafer W.

A drainage path 244 and an exhaust path 245 are connected to an outer periphery side portion 24 of the cup body 2. An annular guide plate 25 extends radially outward from an outer peripheral portion of the inner periphery side portion 21 of the cup body 2 (a position below a peripheral edge of the wafer W). During a normal operation of the substrate processing apparatus 1, an internal space of the cup body 2 is continuously suctioned via the exhaust path 245. An outer peripheral wall 26 is provided on an outer peripheral portion of the outer periphery side portion 24 of the cup body 2. The outer peripheral wall 26 receives, by an inner peripheral surface thereof, fluid (e.g., droplets, gas, and a mixture thereof) scattered outward from the wafer W, and guides the fluid downward. The outer peripheral wall 26 includes an inner fluid receiving surface 261, which is inclined at an angle of 25 to 30 degrees with respect to a horizontal plane so as to be lowered as it goes radially outward, and a return portion 262 extending downward from a vicinity of an upper end portion of the fluid receiving surface 261. Between a top surface 252 of the guide plate 25 and the fluid receiving surface 261, an exhaust flow path 27, via which a fluid mixture including gas (e.g., air, $N_2$ gas, or the like) and droplets of the processing liquid scattered from the wafer W flows, is formed. An upper opening of the cup body 2 is defined by an inner peripheral surface of the return portion 262. An opening diameter of the upper opening is slightly greater than a diameter of the wafer W. When the fluid mixture is turned in a space below the guide plate 25, the droplets are separated from the fluid mixture. The droplets are ejected from the drainage path 244, and the gas is discharged from the exhaust path 245.

The cover 5 is a disk-shaped member located at a processing position (a position illustrated in FIGS. 1 and 3), which is close to and faces the top surface of the wafer W held by the wafer holder 3 when a liquid processing of the wafer W is performed. A diameter of the cover 5 is greater than the diameter of the wafer W. A fluid nozzle 81 configured to supply a fluid to a space between a bottom surface of the cover 5 and the top surface of the wafer W held by the wafer holder 3 is provided in a central portion of the cover 5. A $N_2$ gas source 82 and a DIW source 83 are connected to the fluid nozzle 81. By switching a switching valve 84, either a $N_2$ gas or a cleaning liquid (DIW) can be supplied to the fluid nozzle 81. Although not illustrated, each of fluid lines extending from the $N_2$ gas source 82 and the DIW source 83 toward the switching valve 84 is provided with devices for controlling a flow of the fluid, such as an opening and closing valve, a flowmeter, and a flowrate control valve.

Instead of providing the fluid nozzle 81 for ejecting both the $N_2$ gas and the cleaning liquid (DIW) in the cover 5, a gas nozzle for supplying the $N_2$ gas only and a cleaning liquid nozzle for supplying the cleaning liquid only may be separately provided (not illustrated). In this case, the $N_2$ gas source 82 is connected to the gas nozzle, and the DIW source 83 is connected to the cleaning liquid nozzle.

The cover 5 is provided with a heater 50. It is desirable that the heater 50 is provided to uniformly heat at least an entirety of the bottom surface of the cover 5 (particularly, a region facing the wafer W). The heater 50 is formed by, for example, a resistance heater that generates heat when an electric current is applied.

When the $N_2$ gas is ejected from the fluid nozzle 81 in a state where the cover 5 is located at the processing position and the interior of the cup body 2 is suctioned via the exhaust path 245, the $N_2$ gas flows in a space S (see FIG. 3) between the cover 5 and wafer W toward the outside (from the center toward the peripheral edge of the wafer W). Since the bottom surface of the cover 5 is lower in a peripheral edge portion than in a central portion, a gap between the bottom surface of the cover 5 and the top surface of the wafer W becomes narrow at the peripheral edge portion of the wafer W (see and compare G1 and G2 in FIG. 3). Therefore, a flow velocity of the $N_2$ gas ejected from the fluid nozzle 81 increases in a vicinity of the peripheral edge portion of the wafer W. Accordingly, during the liquid processing of the wafer W, the processing liquid scattered from the wafer W is effectively prevented from adhering to the top surface of the wafer W again.

A ring-shaped seal (lip seal) 59 is provided on the bottom surface of the peripheral edge portion of the cover 5 so as to be in close contact with the top surface of the cup body 2.

By providing the seal 59, the flow of the N₂ gas as described above does not leak from a gap between the top surface of the cup body 2 and the bottom surface of the peripheral edge portion of the cover 5. Therefore, the effect of preventing re-adhesion of the processing liquid due to the flow of N₂ gas as described above is improved.

FIG. 2 is a plan view illustrating a state in which the wafer W is held by the wafer holder 3 and the cover 5 is positioned at the processing position. In FIG. 2, an outer peripheral end (edge) We of the wafer W covered and hidden by the cover 5 is indicated by a one-dot chain line.

As illustrated in FIGS. 1 and 2, the lifting mechanism 6 configured to move the cover 5 vertically includes a plurality of (four in this example) sliders 61 installed on a support 58 configured to support the cover 5, and guide columns 62 extending vertically through the sliders 61, respectively. A cylinder motor (not illustrated) is connected to each of the sliders 61. By driving the cylinder motor, the sliders 61 move vertically along the guide columns 62, whereby the cover 5 can be moved vertically. The cup body 2 is supported by a lifter 65 that forms a part of a cup lifting mechanism (not illustrated in detail). When the lifter 65 is moved down from the state illustrated in FIG. 1, the cup body 2 is moved down so that the wafer W can be delivered between the transfer arm (not illustrated) of a wafer transfer mechanism and the wafer holder 3.

Next, the processing fluid supply part 7 will be described with reference to FIGS. 2, 4A, and 4B. In particular, as illustrated in FIG. 2, the processing fluid supply part 7 includes processing fluid supplies 7A and 7B. The processing fluid supplies 7A and 7B do not appear in the cross section of FIG. 1.

The processing fluid supply 7A includes a chemical liquid nozzle (a processing liquid nozzle) 71 configured to eject SC-1 liquid, which is a mixed solution of ammonia water, hydrogen peroxide solution, and pure water, a rinsing nozzle 72 configured to eject a rinsing liquid (in this example, DIW (pure water)), and a gas nozzle 73 configured to eject a drying gas (in this example, N₂ gas). These nozzles 71 to 73 are held by a common nozzle holder 700A. The processing fluid supply 7B includes a chemical liquid nozzle (a processing liquid nozzle) 74 configured to eject HF liquid, a rinsing nozzle 75 configured to eject a rinsing liquid (in this example, DIW), and a gas nozzle 76 configured to eject a drying gas (in this example, N₂ gas). These nozzles 74 to 76 are held by a common nozzle holder 700B.

Figure 4A:
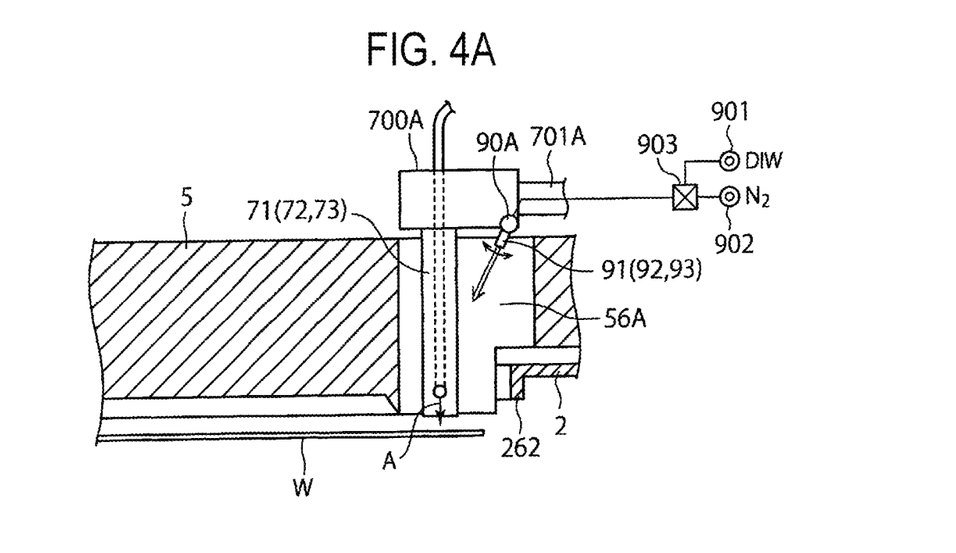
FIG. 4A is a radial cross-sectional view illustrating a processing liquid nozzle and a cleaning nozzle in an embodiment.
Figure 4B:
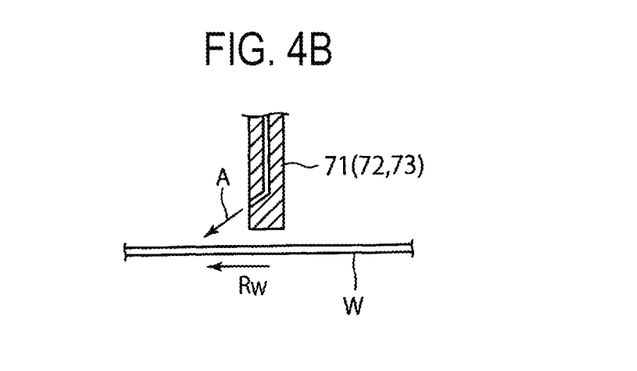
FIG. 4B is a cross-sectional view of the processing liquid nozzle illustrated in FIG. 4A.

As indicated by an arrow A in FIG. 4B, each of the nozzles 71 to 73 ejects the processing fluid obliquely downward such that an ejection direction indicated by the arrow A has a component of a rotation direction Rw of the wafer. The processing fluid is supplied to each of the nozzles 71 to 73 from a processing fluid supply mechanism (not illustrated). The above-described points are similarly applicable to the nozzles 74 to 76 of the processing fluid supply 7B. The processing fluid supply mechanism may be configured to have a processing fluid supply source (a tank for storing the processing fluid or a factory facility for supplying the processing fluid) and flow control devices such as an opening and closing valve, a flowmeter, and a flowrate control valve. The configuration of the processing fluid supply mechanism is known, and a detailed description thereof will be omitted.

As illustrated in FIG. 4A, the nozzle holder 700A of the processing fluid supply 7A is provided with cleaning liquid nozzles 91 to 93 configured to eject a cleaning liquid (e.g., DIW) for cleaning the nozzles 71 to 73 toward the nozzles 71 to 73, respectively. It is desirable that each of the cleaning liquid nozzles 91 to 93 is provided with an angle adjustment mechanism 90A to change a direction thereof. In this case, it is desirable that the angle adjustment mechanism 90A may change a direction of the cleaning liquid ejected from each of the cleaning liquid nozzles 91 to 93 within a range from the horizontal direction (a radially inward direction of the cover 5) to an obliquely downward direction at which the cleaning liquid can directly hit a lower end portion of each of the nozzles 71 to 73. Instead of providing the angle adjustment mechanism 90A, a plurality of ejection ports having different orientations may be provided in each of the cleaning liquid nozzles 91 to 93.

A DIW (cleaning liquid) source 901 and a N₂ gas (drying gas) source 902 are connected to the cleaning liquid nozzles 91 to 93. By switching a switching valve 903, either DIW or a N₂ gas can be supplied to the cleaning liquid nozzles 91 to 93. Although not illustrated, fluid lines, each of which extends from the DIW source 901 and the N₂ gas source 902 toward the switching valve 903, are provided with devices for controlling a flow of a fluid, such as an opening and closing valve, a flowmeter, and a flowrate control valve.

Instead of providing the fluid nozzle 91 for ejecting both of the cleaning liquid (DIW) and the N₂ gas, a cleaning liquid nozzle for ejecting the cleaning liquid only and a gas nozzle for supplying the N₂ gas only may be provided separately (not illustrated). In this case, the DIW source 901 is connected to the cleaning liquid nozzle, and the N₂ gas source 902 is connected to the gas nozzle.

The nozzle holder 700B of the processing fluid supply 7B is also provided with cleaning liquid nozzles 94 to 96 having the same configurations and functions as those of the cleaning liquid nozzles 91 to 93.

Positions of the nozzle holders 700A and 700B can be adjusted in the radial direction of the wafer W by linear actuators 701A and 701B, respectively.

As illustrated in FIGS. 2 and 4A, the nozzles 71 to 73 and 91 to 93 of the processing fluid supply 7A are accommodated in a cutout portion 56A formed in the cover 5. The cutout portion 56A may extend radially inward from an outer peripheral edge of the cover 5. In this case, when the cover 5 is located at the processing position, the nozzles 71 to 73 can be located at the processing position simply by sliding the nozzles 71 to 73 in the horizontal direction. The cutout portion 56A may be a through-hole provided at a position spaced radially inward from the outer peripheral edge of the cover 5. In this case, when the cover 5 is located at the processing position, the nozzles 71 to 73 can be located at the processing position by sequentially moving the entirety of the processing fluid supply 7A upward, forward, and downward.

The nozzles 74 to 76 and 94 to 96 of the processing fluid supply 7B are accommodated in a cutout portion 56B formed in the cover 5. Although a detailed illustration is omitted, the cutout portion 56B and the nozzles 74 to 76 and 94 to 96 may be configured in the same manner as the cutout portion 56A and the nozzles 71 to 73 and 91 to 93. By disposing the chemical liquid nozzle 71 for supplying an alkaline chemical liquid in the cutout portion 56A and disposing the chemical liquid nozzle 74 for supplying an acidic chemical liquid in the cutout portion 56B, a reaction between alkali and acid is prevented.

As schematically illustrated in FIG. 1, the substrate processing apparatus 1 includes a controller (control part) 100 that performs an overall control of the entire operations of the substrate processing apparatus 1. The controller 100 controls operations of all functional components of the substrate processing apparatus 1 (e.g., the rotation drive part 4, the lifting mechanism 6, the wafer holder 3, various processing fluid supply mechanisms, and the like). The controller 100 may be implemented by, for example, a general-purpose computer as hardware and a program (e.g., a device control program, a processing recipe, and the like) for operating the computer as software. The software is stored in a storage medium such as a hard disk drive fixedly provided in the computer, or is stored in a storage medium detachably provided in the computer, such as a CDROM, a DVD, or a flash memory. Such a storage medium is denoted by reference numeral 101 in FIG. 1. A processor 102 calls and executes a predetermined processing recipe from the storage medium 101 based on an instruction from a user interface (not illustrated) or the like when necessary, whereby the respective functional components of the substrate processing apparatus 1 operate under a control of the controller 100 to perform a predetermined process.

Next, an example of a known standard liquid processing operation using the substrate processing apparatus 1 will be described. This operation is performed under the control of the controller 100.

[Wafer Loading]

First, the cover 5 is located at a retracted position (a position above the position in FIG. 1) by the lifting mechanism 6, and the cup body 2 is moved down by the lifter 65 of the cup lifting mechanism. Subsequently, the shutter 12 of the housing 11 is opened to allow the transfer arm (not illustrated) of the external wafer transfer mechanism to enter the housing 11, and the wafer W held by the transfer arm is positioned directly above the wafer holder 3. Subsequently, the transfer arm is moved down to a position lower than the top surface of the wafer holder 3, and the wafer W is placed on the top surface of the wafer holder 3. Subsequently, the wafer is suctioned by the wafer holder 3. Thereafter, the empty transfer arm is retracted from the housing 11. Subsequently, the cup body 2 is moved up and returned to the position illustrated in FIG. 1, and the cover 5 is moved down to the processing position illustrated in FIG. 1. By the procedure described above, loading the wafer is completed, and the state illustrated in FIG. 1 is obtained.

[First Chemical Liquid Process]

Subsequently, a first chemical liquid process is performed on the wafer. The wafer W is rotated, and the $N_2$ gas is ejected from the gas ejection ports 212 and 213 in the cup body 2 so that the wafer W, especially the peripheral edge portion of the wafer W as a processing target, is heated to a temperature suitable for the chemical liquid process (e.g., about 60 degrees C.). When the wafer W is sufficiently heated, a chemical liquid (SC1) is supplied from the chemical liquid nozzle 71 of the processing fluid supply 7A to the peripheral edge portion of the top surface (a device forming surface) of the wafer W while rotating the wafer W, thereby removing an unnecessary film in the peripheral edge portion of the top surface of the wafer.

[First Rinsing Process]

After performing the chemical liquid process for a predetermined time, the ejection of the chemical liquid from the chemical liquid nozzle 71 is stopped, and a rinsing liquid (DIW) is supplied from the rinsing nozzle 72 of the processing fluid supply 7A to the peripheral portion of the wafer W so that a rinsing process is performed. By the rinsing process, the chemical liquid, reaction products, and the like remaining on the top and bottom surfaces of the wafer W are washed away.

[Second Chemical Liquid Process]

Subsequently, a second chemical liquid processing is performed on the wafer W to remove unnecessary substances that cannot be removed by the first chemical liquid process. The wafer W is rotated and heated in the same manner as in the first chemical liquid process, and a chemical liquid (HF) is supplied from the chemical liquid nozzle 74 of the processing fluid supply 7B to the peripheral edge portion of the top surface of the wafer W, thereby removing an unnecessary film in the peripheral edge portion of the top surface of the wafer.

[Second Rinsing Process]

After performing the chemical liquid process for a predetermined time, while the rotation of the wafer W and the ejection of the $N_2$ gas from the gas ejection ports 212 and 213 are continued, the ejection of the chemical liquid from the chemical liquid nozzle 74 is stopped, and a rinsing liquid DIW is supplied to the peripheral edge portion of the wafer W from the rinsing nozzle 75 of the processing fluid supply 7B so that a rinsing process is performed. By the rinsing process, the chemical liquid, reaction products, and the like remaining on the top and bottom surfaces of the wafer W are washed away.

[Drying Process]

After the rinsing process is performed for a predetermined time, while the rotation of the wafer W and the ejection of the $N_2$ gas from the gas ejection ports 212 and 213 are continued (preferably, the rotation speed is increased), the ejection of the rinsing liquid from the rinsing nozzle 75 is stopped, and a drying gas ($N_2$ gas) is supplied from the gas nozzle 76 to the peripheral edge portion of the wafer W so that a drying process is performed.

[Wafer Unloading]

Thereafter, the cover 5 is moved up to the retracted position (not illustrated) and the cup body 2 is moved down. Subsequently, the shutter 12 of the housing 11 is opened to allow the transfer arm (not illustrated) of the external wafer transfer mechanism (not illustrated) to enter the housing 11, and the empty transfer arm is placed below the wafer W held by the wafer holder 3 and is then moved up to receive the wafer W from the wafer holder 3, which is in a state of stopping the suctioning of the wafer W. Thereafter, the transfer arm holding the wafer is retracted from the interior of the housing 11. Thus, a series of processes for a single sheet of wafer is completed.

As described above, during the chemical liquid process, the cover 5 is disposed close to the top surface of the wafer W, and the $N_2$ gas is supplied from the fluid nozzle 81, whereby it is possible to prevent the processing liquid scattered from the wafer W from adhering to the top surface of the wafer W again. However, a part of the chemical liquid supplied from the chemical liquid nozzles 71 and 74 to the wafer W may bounce off the wafer W or the inner wall of the cup body 2, and may adhere to the cover 5. In addition, in the cutout portions 56A and 56B of the cover 5 in which the chemical liquid nozzles 71 and 74 are accommodated during the liquid process, a gas flow of the $N_2$ gas supplied from the fluid nozzle 81 is disturbed. Therefore, a mist of the chemical liquid bounced off the wafer W or the inner wall of the cup body 2 tends to adhere to a sidewall surface of the cutout portions 56A and 56B or the peripheral edge portion of the bottom surface of the cover 5 in the vicinity of the cutout portions 56A and 56B.

When the procedure described above, that is, when the chemical liquid process with SC1 is performed and then the chemical liquid process with HF is performed, droplets or a mist of the SC1 liquid adheres to the cover 5, and then droplets or a mist of the HF liquid adheres to the cover 5. When these two chemical liquids are mixed on the surface of the cover 5, they react with each other to produce ammonium fluoride ($NH_4F$). When the procedure described above is repeatedly performed, an amount of produced ammonium fluoride increases and the ammonium fluoride eventually crystallizes. When the crystallized ammonium fluoride falls on the wafer W, it causes generation of particles. The cause of generation of particles is not limited to the case where reaction products (solids) derived from two or more types of chemical liquids fall as described above. A similar problem may occur when solids derived from a single chemical liquid or substances removed from a substrate falls, or when a chemical liquid adhering to the cover 5 gathers and drips from the cover 5.

In the present embodiment, the cover 5 is cleaned regularly or irregularly. The cleaning of the cover 5 may be performed each time a processing of one sheet of wafer W is completed or each time a processing of a predetermined number of wafers W is completed. The cleaning of the cover 5 may be performed when it is detected that a problematic level of deposits has adhered to the cover 5. In addition, it is desirable that the nozzles 71 to 76 and the cup body 2 are cleaned together with the cleaning of the cover 5. Hereinafter, an exemplary procedure for cleaning the cover 5, the nozzles 71 to 76, and the cup body 2 will be described.

First, a cleaning disk D is suctioned by the wafer holder 3 by the same procedure as the above-described "Wafer Loading." In addition, the cup body 2 is moved up to the processing position, and the cover 5 is moved down to the processing position. That is, the cleaning disk D is installed in the substrate processing apparatus 1 in the same manner as the wafer W illustrated in FIG. 1. The interior of the cup body 2 is suctioned via the exhaust path 245 as in the normal operation of the substrate processing apparatus 1. The cleaning disk D may be configured as a disk-shaped member having the same shape and size as those of a product wafer W. A slight slope may be provided on a peripheral edge portion of a surface of the cleaning disk D such that the surface of the cleaning disk D increases as it approaches a peripheral edge thereof.

[Nozzle Cleaning Process]

Subsequently, a cleaning liquid (here, for example, DIW) is sprayed from the cleaning liquid nozzles 91 to 96 toward the nozzles 71 to 76, respectively, so as to clean surfaces of the nozzles 71 to 76. At this time, for example, the cleaning process may be performed while changing landing positions of the cleaning liquid on the nozzles 71 to 76 by using the angle adjustment mechanism (e.g., 90A). At this time, the cleaning disk D may or may not be rotated.

[Cover Body Cleaning Process]

Figure 5A:
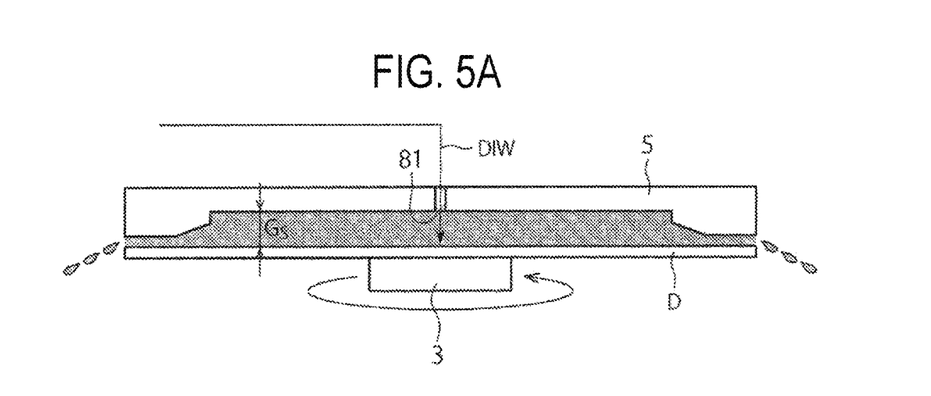
FIG. 5A is a schematic view for explaining one step of a cleaning process in an embodiment.

Subsequently, a vertical distance between the bottom surface of the cover 5 and a top surface of the cleaning disk D is adjusted to a first distance. In addition, it is desirable that a vertical position of the cover 5 when the vertical distance is the first distance is slightly lower than the processing position. For example, if the distance G1 (see FIG. 3) when the cover 5 is located at the processing position is set to 0.8 to 0.9 mm, the distance G1 during the cover body cleaning process can be reduced to about 0.7 mm. In this state, as illustrated in FIG. 5A, the cleaning disk D is rotated at a speed within a range from a low speed to a medium speed (specifically, for example, 50 rpm to 500 rpm), and the cleaning liquid (e.g., DIW) is supplied from the fluid nozzle 81. At this time, the rotation speed may vary between a low speed (e.g., 50 rpm) and a medium speed (e.g., 100 rpm to 500 rpm). By varying the rotation speed, a cleaning range may be changed. By appropriately adjusting an amount of the cleaning liquid supplied from the fluid nozzle 81, the space S between the bottom surface of the cover 5 and the top surface of the cleaning disk D is filled with the cleaning liquid. The cleaning liquid flows outward in the space S while filling the space S, and is spilled out of the space S via a gap between the peripheral edge portion of the cover 5 and a peripheral edge portion of the cleaning disk D. The spilled cleaning liquid is collected in the cup body 2. The bottom surface of the cover 5 can be cleaned by the cleaning liquid flowing as described above.

During the cover body cleaning process, it is desirable that the cleaning liquid is ejected from the cleaning liquid nozzles 91 to 96 in the horizontal direction, that is, toward the wall surfaces of the cutout portions 56A and 56B (particularly, the wall surfaces facing radially outward). As a result, in addition to the bottom surface of the cover 5, it is possible to clean the wall surfaces of the cover 5 facing the cutout portions 56A and 56B.

[Cup Body Cleaning Process]

Figure 5B:
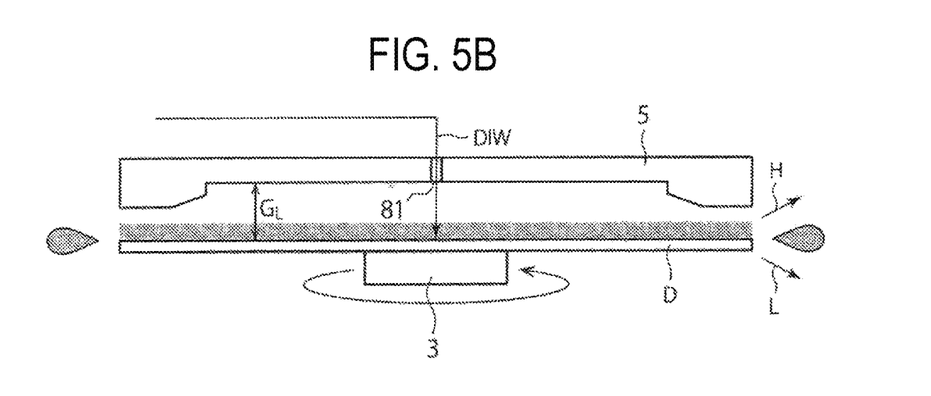
FIG. 5B is a schematic view for explaining another step of the cleaning process in an embodiment.

Subsequently, the vertical distance between the bottom surface of the cover 5 and the top surface of the cleaning disk D is adjusted to a second distance greater than the first distance. In this state, the cleaning disk D is continuously rotated, and the cleaning liquid (e.g., DIW) is supplied from the fluid nozzle 81. In this case, as illustrated in FIG. 5B, the cleaning liquid reaches a vicinity of a rotation center of the cleaning disk D, and then flows toward the peripheral edge of the wafer W by a centrifugal force and is scattered outward. The inner wall surface of the cup body 2 can be cleaned by the cleaning liquid scattered outward. In addition, at this time, since the cover 5 is sufficiently separated from the top surface of the cleaning disk D, even when the cleaning liquid is supplied from the fluid nozzle 81 at a large flow rate, the cleaning liquid does not fill the space S between the bottom surface of the cover 5 and the top surface of the cleaning disk D. By changing the rotating speed of the cleaning disk D, it is possible to change an arrival point of the cleaning liquid scattered from the cleaning disk D on the cup body 2. That is, by increasing the rotating speed of the cleaning disk D, it is possible to clean a higher portion of the cup body 2 (see arrow H), and by decreasing the rotating speed of the cleaning disk D, it is possible to clean a lower portion (see arrow L). The rotating speed of the cleaning disk D may vary, for example, between 50 and 1,000 rpm.

[Cover Body Drying Process]

Subsequently, a drying gas is supplied from the fluid nozzle 81 while rotating the cleaning disk D, preferably, at a high speed (e.g., 1,000 rpm or more). As the drying gas, the $N_2$ gas used in the liquid processing of a product wafer W may be used. Instead of the $N_2$ gas, an appropriate gas having a lower humidity than normal air, for example, dry air, may be used. In addition, at this time, it is desired that an electric current is applied to the heater 50 provided on the cover 5, whereby it is possible to promote drying of the cover 5. The vaporized cleaning liquid is discharged from the space S along with a flow of the drying gas, which is spilled out of the space S after flowing through the space S from a central portion of the cleaning disk D to the peripheral edge portion of the cleaning disk D.

During the cover body drying process, it is desirable that the drying gas (e.g., $N_2$ gas) is ejected from the cleaning liquid nozzles 91 to 96 toward the wall surfaces of the cutout portions 56A and 56B (particularly, the wall surfaces facing radially outward). As a result, in addition to the bottom surface of the cover 5, it is possible to promote drying of the wall surfaces of the cover 5 facing the cutout portions 56A and 56B, and drying of the cleaning liquid nozzles 91 to 96.

In the cover body drying process, it is desirable that the vertical distance between the bottom surface of the cover 5 and the top surface of the cleaning disk D is greater than the vertical distance in the cover body cleaning process. By setting the vertical distance as described above, a gap between the peripheral edge portion of the bottom surface of the cover 5 and the top surface of the cup body 2 is widened (the seal 59 is spaced apart from the top surface of the cup body 2), and the air permeability in the space S between the bottom surface of the cover 5 and the top surface of the cleaning disk D is improved. Therefore, the cleaning liquid evaporated from the bottom surface of the cover 5 is not only suctioned into the cup body 2, but also discharged from the housing 11 along with an air flow from the clean air introduction unit 14 toward the exhaust port 15. Accordingly, it is possible to promote the drying of the cover 5.

In the cover body drying process, it is desirable that an exhaust amount of the cup body 2 via the exhaust path 245 (an exhauster) is greater than that in the cover body cleaning process. By setting the exhaust amount as described above, a flow of the drying gas suctioned into the cup body 2 is promoted, whereby drying efficiency of the bottom surface of the cover 5 is improved.

In order to promote the drying of the cover 5 during the cover body drying process, a rotation drive mechanism configured to rotate the cover 5 may be provided. In this case, the heater 50 of the cover 5 may be omitted.

According to the embodiment described above, by supplying the cleaning liquid to the top surface of the cleaning disk D while rotating the cleaning disk D in the state in which the vertical distance between the top surface of the cleaning disk D and the bottom surface of the cover 5 is set to the first distance, it is possible to efficiently clean the bottom surface of the cover 5 by the cleaning liquid that fills the space S between the top surface of the cleaning disk D and the bottom surface of the cover 5. In addition, after cleaning the cover 5, by stopping the supply of the cleaning liquid and rotating the substrate (cleaning disk D) in the state in which the vertical distance is set to the second distance greater than the first distance, it is possible to efficiently dry the bottom surface of the cover 5.

In addition, ammonium fluoride produced by a reaction between SC1 and HF as exemplified above can be removed by thermal decomposition by heating the cover using a heater built in the cover (see, for example, Patent Document 1). However, substances that can be removed by thermal decomposition are limited. In addition, substances adhering to a portion other than the cover cannot be removed. In contrast, according to the embodiment described above, it is possible to deal with removal of various adhering substances by an appropriate cleaning liquid. Furthermore, in the embodiment described above, it is easy to clean members around the cover when cleaning the cover.

It should be understood that the embodiments disclosed herein are illustrative and are not limiting in all aspects. The above embodiments may be omitted, replaced, or modified in various forms without departing from the scope and spirit of the appended claims.

EXPLANATION OF REFERENCE NUMERALS

3: substrate holder, 4: rotation drive part, 5: cover, 81, 83: cleaning liquid supply, D: substrate (cleaning substrate)

What is claimed is:
1. A substrate processing apparatus comprising:
   a substrate holder configured to hold a substrate;
   a rotation drive part configured to rotate the substrate holder;
   a disk-shaped cover configured to cover an entirety of a top surface of the substrate held by the substrate holder;
   a lifting mechanism configured to move the cover vertically;
   a fluid nozzle provided at a center portion of the cover in a plan view, and configured to supply a cleaning liquid to the top surface of the substrate covered by the cover; and
   a controller configured to control the substrate processing apparatus to execute:
      a cleaning process of cleaning at least a bottom surface of the cover by the cleaning liquid that fills a space between the top surface of the substrate and the bottom surface of the cover by supplying, in a state in which a vertical distance between the top surface of the substrate held by the substrate holder and the bottom surface of the cover is set to a first distance, the cleaning liquid to the top surface of the substrate from the fluid nozzle while rotating the substrate by the rotation drive part; and
      after the cleaning process, a drying process of drying at least the bottom surface of the cover by stopping, in a state in which the vertical distance is set to a second distance greater than the first distance, the supply of the cleaning liquid from the fluid nozzle while rotating the substrate by the rotation drive part.

2. The substrate processing apparatus of claim 1, wherein the controller is further configured to control the rotation drive part such that a rotating speed of the substrate in the drying process is higher than a rotating speed of the substrate in the cleaning process.

3. The substrate processing apparatus of claim 1, further comprising:
   a cup body surrounding the substrate holder and configured to collect the cleaning liquid scattered from the substrate; and
   an exhauster configured to suction an internal space of the cup body,
   wherein the controller is further configured to control the exhauster such that an exhaust amount by the exhauster in the drying process is greater than an exhaust amount by the exhauster in the cleaning process.

4. The substrate processing apparatus of claim 1, further comprising:
   a low humidity gas supply part configured to supply a low humidity gas to a space in a vicinity of the substrate holder and the cover,
   wherein the controller is further configured to control an amount of the low humidity gas supplied from the low humidity gas supply part such that a humidity of the space in the vicinity of the substrate holder and the cover in the drying process is lower than a humidity of the space in the vicinity of the substrate holder and the cover in the cleaning process.

5. The substrate processing apparatus of claim 1, further comprising:
   a processing liquid nozzle configured to supply a processing liquid for processing the substrate to a peripheral edge portion of the top surface of the substrate covered by the cover; and
   a cleaning liquid nozzle configured to supply the cleaning liquid for cleaning the processing liquid nozzle to the processing liquid nozzle.

6. The substrate processing apparatus of claim 5, further comprising:

a drying gas nozzle configured to supply a drying gas for drying the processing liquid nozzle, which has been cleaned by the cleaning liquid from the cleaning liquid nozzle, to the processing liquid nozzle; or a drying gas supply part configured to supply the drying gas to the cleaning liquid nozzle such that the drying gas is supplied from the cleaning liquid nozzle to the processing liquid nozzle.

7. The substrate processing apparatus of claim 1, further comprising:

a heater provided in the cover, wherein the controller is further configured to control the heater to heat the cover in the drying process.

8. A method of cleaning at least a disk-shaped cover in a substrate processing apparatus, which includes a substrate holder configured to hold a substrate, a rotation drive part configured to rotate the substrate holder, the cover configured to cover an entirety of a top surface of the substrate held by the substrate holder, a lifting mechanism configured to move the cover vertically, and a fluid nozzle provided at a center portion of the cover in a plan view, and configured to supply a cleaning liquid to the top surface of the substrate covered by the cover, the method comprising:

a cleaning process of cleaning at least a bottom surface of the cover by the cleaning liquid that fills a space between the top surface of the substrate and the bottom surface of the cover by supplying, in a state in which a vertical distance between the top surface of the substrate held by the substrate holder and the bottom surface of the cover is set to a first distance, the cleaning liquid to the top surface of the substrate from the fluid nozzle while rotating the substrate by the rotation drive part; and after the cleaning process, a drying process of drying at least the bottom surface of the cover by stopping, in a state in which the vertical distance is set to a second distance greater than the first distance, the supply of the cleaning liquid from the fluid nozzle while rotating the substrate by the rotation drive part.

\* \* \* \* \*